United States Patent [19]

Kroeker et al.

[11] Patent Number: 5,235,740
[45] Date of Patent: Aug. 17, 1993

[54] PRESS WITH PIN DETECTION FOR INTERFERENCE CONNECTORS

[75] Inventors: Elmer L. B. Kroeker, Round Rock; Tony R. Kroeker, Georgetown, both of Tex.; Robert N. Sage, Allentown, Pa.

[73] Assignee: International Business Machines Corporation, Armonk, N.Y.

[21] Appl. No.: 673,906

[22] Filed: Mar. 22, 1991

[51] Int. Cl.$^5$ .................. B23P 19/04; H05K 3/32
[52] U.S. Cl. ........................... 29/741; 29/757; 29/837; 29/845
[58] Field of Search ............... 29/705, 739, 740, 741, 29/757, 759-761, 832, 834-838, 845; 324/72.5, 158 F, 158 P, 158 R, 537, 538

[56] References Cited

U.S. PATENT DOCUMENTS

| | | | |
|---|---|---|---|
| 2,977,530 | 3/1961 | Cook | 324/51 |
| 3,676,776 | 7/1922 | Bauer et al. | 324/72.5 |
| 3,806,800 | 4/1974 | Bove et al. | 324/51 |
| 3,932,931 | 1/1976 | Wright | 29/739 X |
| 4,061,969 | 12/1977 | Dean | 324/73 |
| 4,102,043 | 7/1978 | Andrade et al. | 29/757 X |
| 4,142,286 | 3/1979 | Knuth et al. | 29/757 X |
| 4,357,575 | 11/1982 | Uren et al. | 324/158 |
| 4,463,310 | 7/1984 | Whitley | 324/73 |
| 4,504,783 | 3/1985 | Zasio | 324/73 R |
| 4,627,157 | 12/1986 | Campisi et al. | 29/741 |
| 4,704,700 | 11/1987 | Linker et al. | 364/550 |
| 4,727,317 | 12/1988 | Oliver | 324/158 |
| 4,733,459 | 3/1988 | Tateno | 29/741 |

FOREIGN PATENT DOCUMENTS 596408  3/1978  U.S.S.R. ................. 29/757

OTHER PUBLICATIONS

IBM Technical Disclosure Bulletin "Bed-of-Nails Fixture for Printed-Circuit Board Testing," vol. 23, No. 3, Aug. 1980, pp. 1228-1230.
IBM Technical Disclosure Bulletin "Bi-Level Probes" vol. 26, No. 6, Nov. 1983, p. 2870.

Primary Examiner—Joseph M. Gorski
Assistant Examiner—Peter D. Vo
Attorney, Agent, or Firm—Mark E. McBurney

[57] ABSTRACT

A method and apparatus is provided which allows simultaneous placement of electrical components on to a printed circuit board (PCB). Further, verification of the proper placement of these components on the PCB is provided such that an operator can immediately replace any components having pins which are bent, deformed, or the like. A press is included with moveable platens which receive a product specific assembly that is used in the manufacture of a particular type of PCB. For example, a PCB may require a number of electrical components, such as card connectors to be affixed thereto. This product specific assembly includes a top plate, pressure bar, which contacts the component being pressed into place, and an intermediate spring. A bottom plate is provided and includes a test block assembly. The test block serves to support the PCB receiving the electrical component and verifies the presence of each pin of the component in its respective via. An electrical contact is placed adjacent the vias in the PCB which are to receive the pins. If the pin is not present or does not extend through the via a sufficient distance, then an indication is provided to the operator.

22 Claims, 7 Drawing Sheets

PRESS WITH PIN DETECTION FOR INTERFERENCE CONNECTORS

BACKGROUND OF THE INVENTION

1. Field of the Invention

The present invention relates generally to the assembly of electronic components on to a printed circuit board (PCB). Simultaneous to the components being pressed on to the PCB the present invention performs a test to ensure that all of the contact points (pins) of the electrical component are present in their respective holes (vias) in the PCB. Further, the present invention determines whether the pins are fully extended through the vias in order to allow for subsequent permanent affixation of the electrical components to the PCB by soldering, or the like.

Prior to the present invention, circuit board assembly personnel were required to manually force each component into an engaged relation with the PCB. The types of connection utilized by these components often include those of the interference type. That is, a post or the like is forced into a hole within the PCB having a diameter smaller than that of the post. It can be understood that a great deal of force is required to complete this type of connection. Further, if the required force is not applied uniformly from a vertical direction, the pins will become bent and deformed and not enter the vias contained within the PCB. Thus, a need exists for a means of simultaneously pressing at least one interference type electrical component on to a PCB. Additionally, the capability is needed to immediately determine if each pin on all of the components being placed on to the PCB have ben inserted through the vias a sufficient distance to ensure proper affixation.

A conventional system is described by U.S. Pat. No. 4,627,157 wherein components are individually connected (crimped) and tested as they are successively placed on to a circuit board. U.S. Pat. No. 4,733,459 describes inserting, but not testing, electronic parts into a PCB, by an apparatus including a positioning mechanism and pivotable hand portion. U.S. Pat. No. 4,463,310 shows testing for the presence of components on a previously assembled circuit board but makes no provision for simultaneously placing and concurrently testing components during a single operation.

It can be seen that a need exists for an apparatus and method of simultaneously placing a plurality of individually configured electrical components, having interference connections, on to a PCB. Further, a means of immediately verifying, to an operator, that proper placement of the component on to the PCB has occurred would be desirable.

SUMMARY OF THE INVENTION

In contrast to the prior art, the present invention is a tool which allows simultaneous placement of electrical components on to a printed circuit board. Further, testing for the proper placement of these components on the PCB is performed such that an operator can immediately replace any components having pins which are bent, deformed, or the like.

A press is provided having moveable platens which receive a product specific assembly that is used in the manufacture of a particular type of PCB. For example, a PCB may require a number of electrical components, such as card connectors, or the like, to be affixed thereto. This product specific assembly includes a top plate and pressure bar, which contacts the component being pressed into place, and a spring intermediate therebetween. A bottom plate is provided and includes a test assembly block attached thereto. The test block serves to support the PCB receiving the electrical component and verifies the presence of each pin of the component in the respective via. An electrical contact is placed adjacent the vias in the PCB which are to receive the pins. If the pin is not present, or does not extend through the via a sufficient distance, then an indication of a faulty connection is provided to the operator.

The product specific assembly is placed between the platens of the press such that closing the platens will apply a uniform force to the electrical component and press it into place on the PCB. Simultaneously, an indication of proper pin placement is provided to the operator.

In accordance with the previous summary, objects, features and advantages of the present invention will become apparent to one skilled in the art from the subsequent description and the appended claims taken in conjunction with the accompanying drawings.

BRIEF THE DRAWINGS

DETAILED DESCRIPTION OF THE PREFERRED EMBODIMENTS

Figure 1:
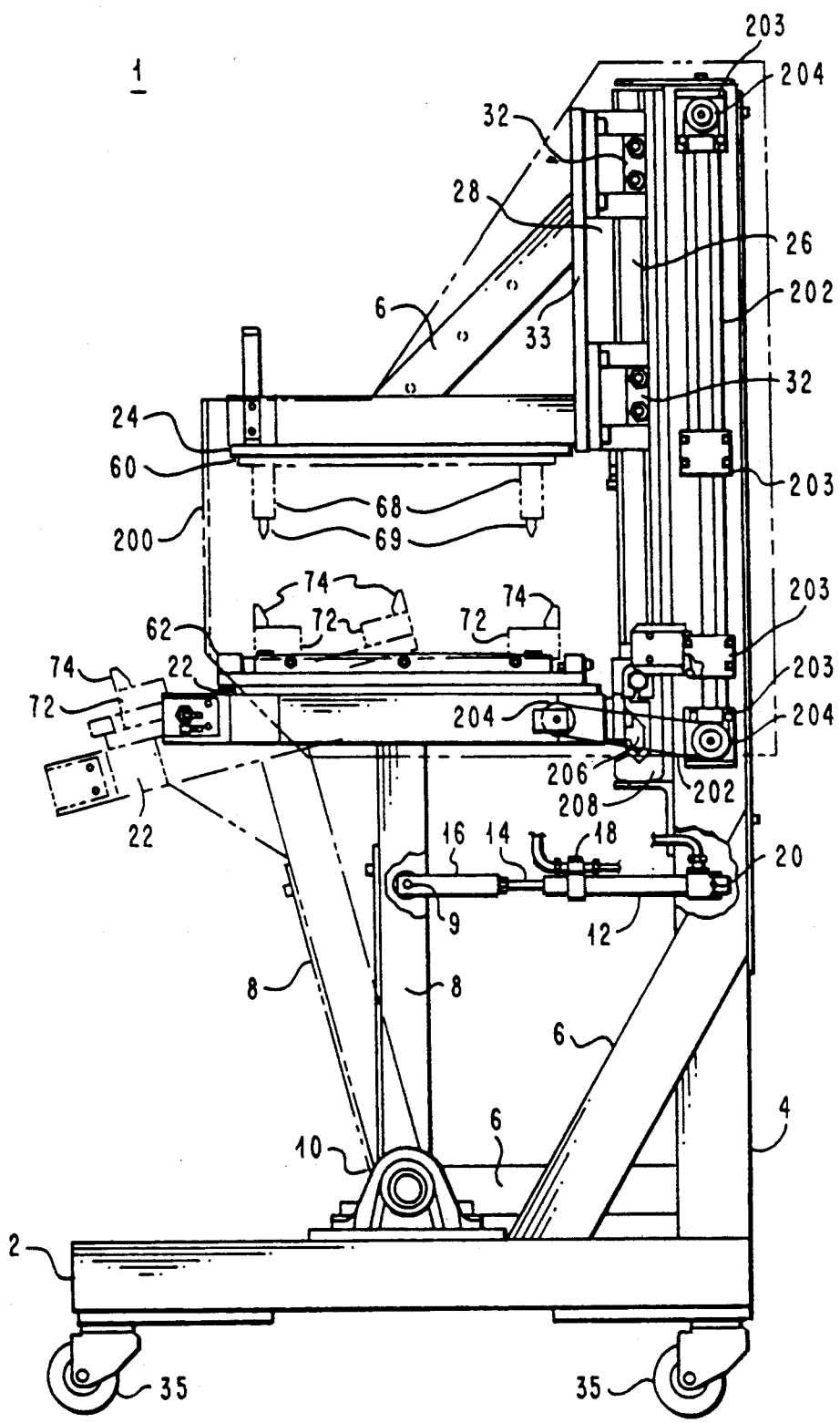
FIG. 1 is a schematic diagram showing the right side elevation of the press apparatus of the present invention.

Referring to FIG. 1 a right side elevation view of the press apparatus of the present invention is shown generally by reference numeral 1. A base portion 2 supports the weight of the press and is mounted upon rollers 35 which provide for mobility of the press apparatus 1. A support member 4 rises vertically from base 2 and is supported by various braces 6. A plate support 8 is shown in a substantially vertical position, which is the normal operating position during the actual press operation. Additionally, support 8 is shown tilted outwardly to accommodate the press operator. Member 8 is utilized to support a lower base platen 22 and is pivotally attached to the base 2 through a connector 10 which may be a pin and hole, ball bearing arrangement, or the like. The actual outward tilting of support 8 and platen 22 is implemented by a fluid pressure system. A cylinder 12, which may be hydraulic, pneumatic, or the like is provided and includes a ram 14 and control valves 18 and 20 which provide fluid pressure that will control the movement of ram 14 within cylinder 12. Ram 14 is then connected to support member 8 through a yoke 16 and pin 9. Of course, connection means other than a yoke an pin arrangement are contemplated by the present invention. Thus, it can be seen how the lower platen 22 is outwardly disposed when cylinder 12 is activated. For example, fluid pressure applied to valve 20 will cause ram 14 to extend outwardly thereby tilting lower platen 22 toward an operator. Conversely, fluid pressure applied to valve 18 will cause ram 14 to retract and return member 8 to a substantially vertical position and platen 22 to a substantially horizontal position.

Additionally a top platen 24 provides the downward force which is required to press an interference type electrical component, or the like into a printed circuit board. A track 26 is mounted substantially adjacent support 4 and parallel thereto. A mechanical connection is made between track 26 and a vertical support plate 33 by way of a slidingly engaged mechanical connector 32. Support plate 33 is in mechanical communication with a brace 6 and ultimately with top platen 24. Again, a fluid pressure system is utilized by the present invention to provide the vertical movement of platen 24 with respect to bottom platen 22. A cylinder 28 is shown (FIG. 3) and is in rigid communication with sliding engagement means 32. Rams 34, associated with cylinders 28, are rigidly affixed to the base portion of the press apparatus 1 such that upon actuation of hydraulic cylinders 28, top platen 24 will be vertically disposed with relation to bottom platen 22. More particularly, valves 31 and 37 are shown on cylinders 28 of FIG. 3. Upon application of fluid pressure to valves 31 it will be understood that outward pressure is then applied to rams 34. Since rams 34 are rigidly affixed to support member 4 or the like, cylinders 28 are then vertically raised due to the rigid attachment of ram 34. In this manner the top platen 24 is raised when fluid pressure is applied through valve 31. Conversely, when fluid pressure is applied to valve 37, cylinders 28 attempt to withdraw rams 34 (i.e. inward pressure is applied to rams 34), but due to their rigid affixation cylinders 28 are drawn in a downward vertical direction which will lower top platen 24 with respect to bottom platen 22. It can be seen that a preferred embodiment of the press apparatus of the present invention employs fluid pressure systems to effectively raise and lower the top platen 24 of press 1 with respect to the base portion, i.e. lower platen 22. As previously noted, a fluid pressure system is utilized to outwardly tilt lower platen 24 towards an operator of press 1. It should be noted that the foregoing description of press 1 is provided for exemplary purposes only and is not intended to limit the scope of the present invention to the arrangement depicted in FIGS. 1-3 and described above.

Figure 2:
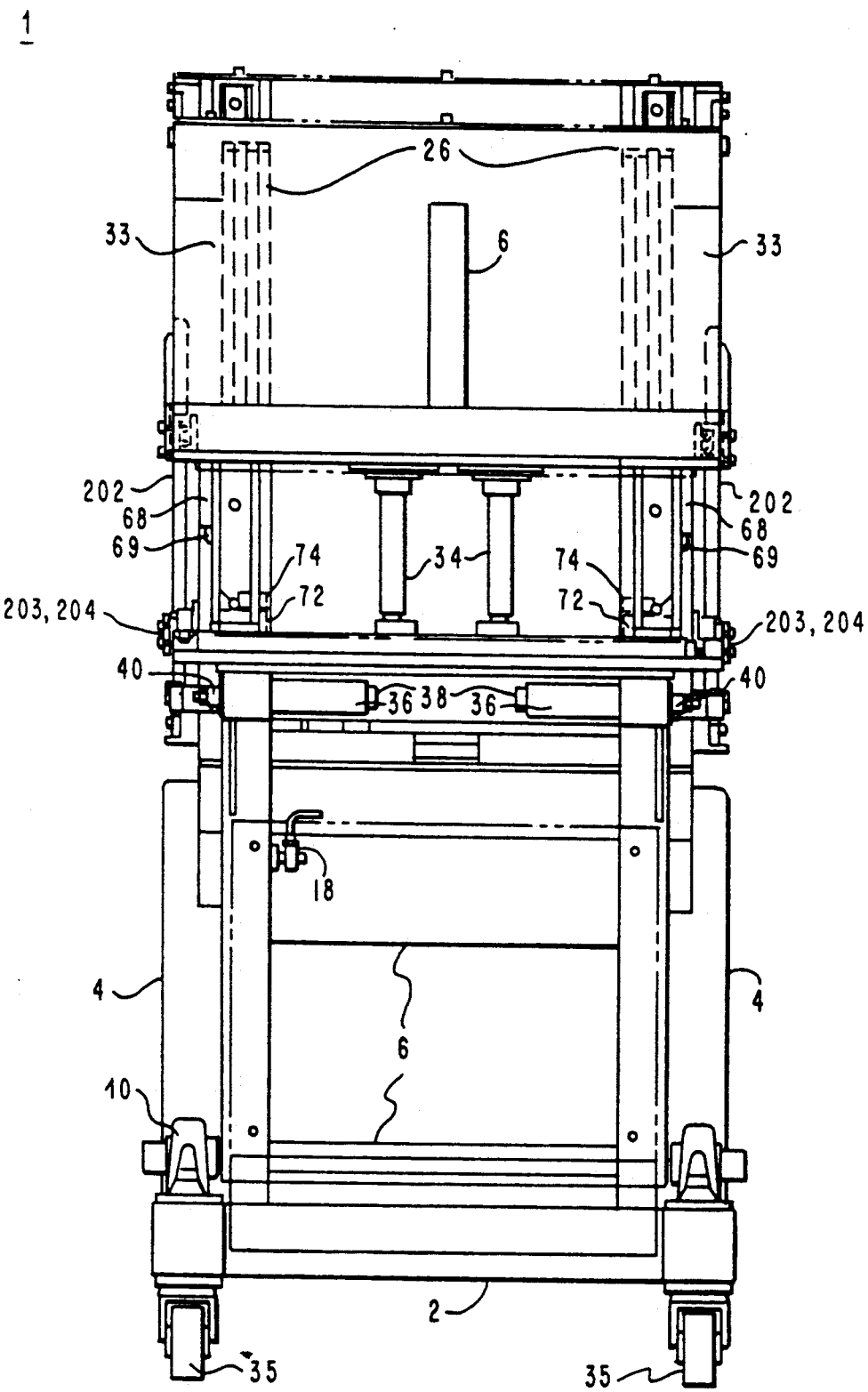
FIG. 2 is a front side elevation of the press.

Referring to FIG. 2, a front elevation of the press apparatus is shown. Reference numerals corresponding to components of press 1 which have been previously described with regard to FIG. 1 refer to the identical elements as previously discussed. Handles 36 are provided to allow an operator to easily operate the fluid pressure systems used to control the outward tilting lower platen 22 and vertically moving upper platen 24 (FIG. 1). Switches 38 are provided on a distal end of handles 36 and can be easily engaged by application of pressure from an operator s thumb. The application of pressure upon switches 38 will activate fluid pressure valves 40, located adjacent handles 36 on an end opposite from switches 38. In this manner, fluid pressure is provided to valves 18 and 20 thereby allowing outward tilting of lower platen 22, as well as providing fluid pressure to valves 31 and 37 in order to provide for the vertical movement of top platen 24. It should be noted that the fluid pressure circuit can be designed such that application of pressure to both switches 38 is required in order to allow vertical movement of top plate 24. This type of configuration will add a safety feature to the present invention since both of the operators hands must be utilized to initiate a movement of platen 24 and therefore they cannot be inadvertently placed in the path of platen 24 as it is lowered. Other safety features include a transparent cover 200 (FIG. 1) made of plexiglass, or the like which opens upon activation by a series of interconnected belts 202, brackets 203 and pulleys 204, which are connected to a drive means (not shown) such as a motor or the like. Locking means 206 is also provided which is in releasable communication with a bracket 208. Thus, lower platen 22 cannot be tilted outwardly until the locking means 206 is released by the operator.

Figure 3:
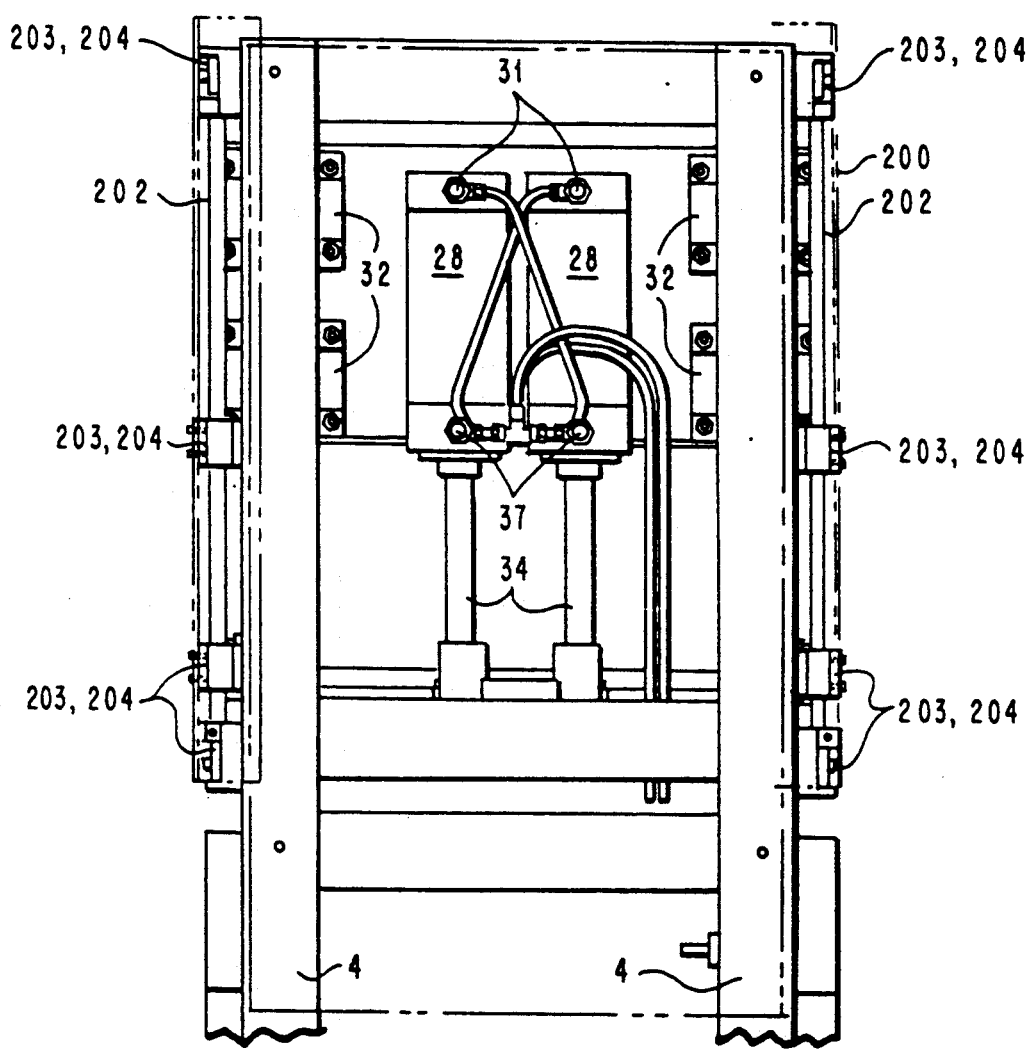
FIG. 3 is an elevation of the back side of the top portion of the press.

FIG. 3 shows a back elevation view of the top portion of press 1 and has been previously described during the discussion of the vertical movement of the top platen 24 and the relation thereto of fluid pressure cylinder 28, along with ram 34, and valves 31 and 37.

Figure 4:
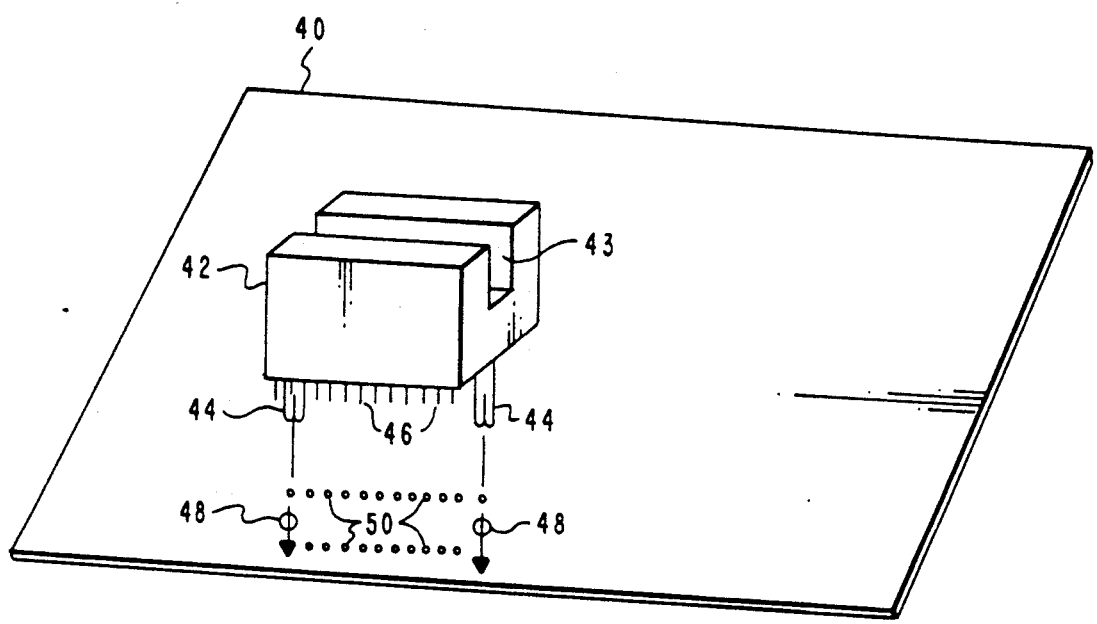
FIG. 4 is a perspective view of a representative electrical component which is placed on a printed circuit board by the press apparatus of the present invention.

A representative type of electrical component which can be mounted and tested by the present invention is illustrated in FIG. 4. A substrate, or printed circuit (PCB) is referred to by numeral 40, and an interference type electrical component which is to be placed on to PCB 40 is shown by reference numeral 42. It can be seen that component 42 is a connector which may be placed on to the PCB 40, thereby allowing a connection between the PCB 40, and an adapter card or the like which is placed within cavity 43 of component 42. It can be seen from FIG. 4 that component 42 is an interference type connector which includes alignment posts 44. Posts 44 are designed to mate with corresponding holes 48 which have been formed through PCB 40. Since component 42 is of the interference type, the outside diameter of post 44 will be greater than the diameter of holes 48 such that a great deal of force is required to seat connector 42 onto PCB 40. A plurality of connector pins 46 are exposed linearly along each side of connector 42. Further, it can be seen that pins 46 will mate with vias 50, which have been formed in PCB 40, such that an electrical connection is made between PCB 40, connector 42 and ultimately to an adapter card, or the like (not shown) which will be connected via cavity 43 to connector 42. It can be understood that due to the amount of force required to seat connector 42 onto PCB 40 a very small misalignment of pins 46 with respect to vias 50 will result in pins 46 being bent or deformed such that electrical contact between connector 42 and PCB 40 is not achieved.

Figure 5:
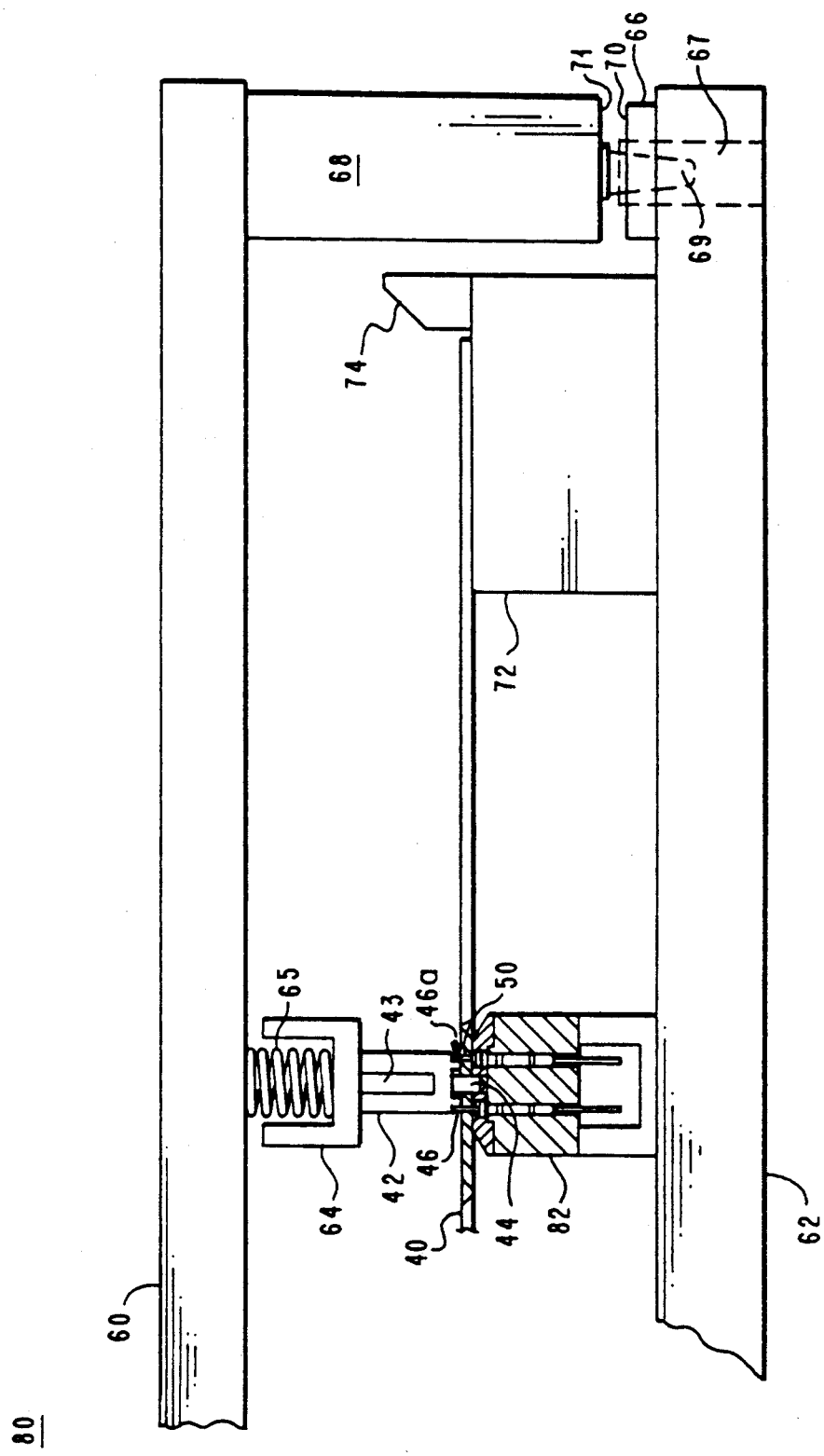
FIG. 5 illustrates a product specific insert utilized for configuring various printed circuit boards with electrical components for use in a particular computer product.
Figure 8:
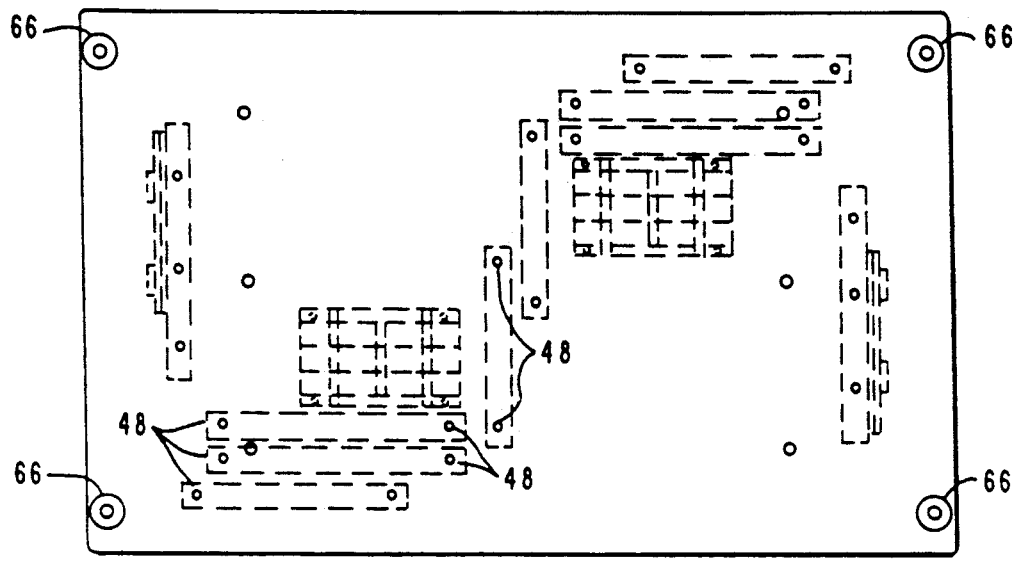
FIG. 8 is a plan view of the lower plate of the product specific insert taken along line 8—8 of FIG. 7.
Figure 7:
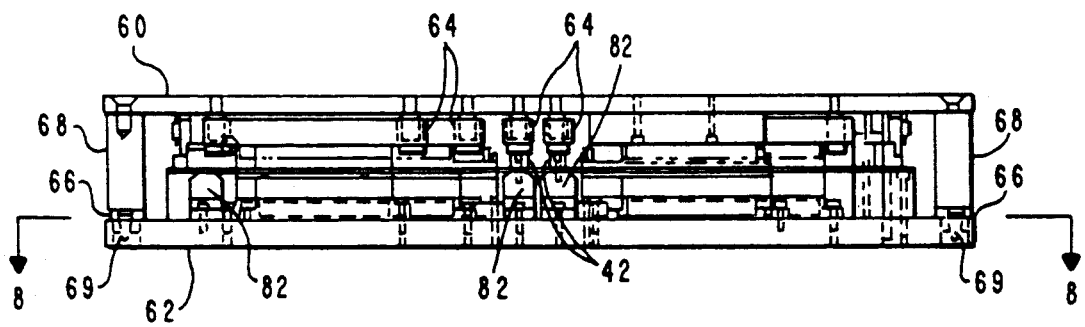
FIG. 7 is an elevation view of a representative set of product specific plates for use in the product specific insert of the present invention.

Referring to FIG. 5, a product specific insert is shown and generally described by reference numeral 80. The top plate 60 and bottom plate 62 are provided which are releasably affixed to top platen 24 and bottom platen 22, respectively of press 1. Attached to top plate 60 are alignment means 68, such as a post or the like having a tapered end 69. Additionally, at least one spring 65 is affixed to top plate 60 by conventional means such as welding or the like. The opposite end of spring 65 is affixed to a pressure plate 64 which abuts the electrical component 42 being pressed into circuit board 40. Although a single spring 65 and pressure plate 64 are illustrated by FIG. 5, it should be understood that a plurality of such spring and plate assemblies can be attached to top plate 60 such that plural components 42 can be simultaneously pressed into PCB 40 (FIGS. 7 and 8). Spring 65 is utilized to ensure that a constant uniform downward force is applied to component 42. Therefore, it can be seen that top plate 60 may have a plurality of springs 65 attached thereto, each having a different tension to correspond to the particular component 42 being pressed into PCB 40. Additionally, springs 65 of different lengths can be provided such that components 42 having different heights can be simultaneously pressed into the circuit board 40.

Attached to bottom plate 62 are a plurality of test blocks 82. PCB supports 72 and travel stops 66. One test block 82 will be provided for each particular component 42 being pressed into the circuit board 40. The circuit board supports 72 will be disposed in a substantially rectangular arrangement on bottom plate 60 and will correspond to the four corners of PCB 40. Guides 74 are rigidly affixed to supports 72 and ensure that PCB 40 is properly aligned by the operator during insertion of the board during the mounting operation. Stop 66 is utilized to receive the tapered end 69 into a cylindrical cavity 67 thereby ensuring that top plate 60 and bottom plate 62 maintain vertical alignment therebetween. Additionally, stop 66 provides a shoulder 70 which abuts a shoulder 71 of alignment means 68 when the proper downward vertical distance of top plate 60 is achieved. In this manner, over-travel of top plate 60, relative to bottom plate 62, is prevented and damage to components 42 is avoided. It can be seen that since guide 74 maintains the alignment of PCB 40 with respect to bottom plate 62 and test block 82, and alignment means and stops 66 maintain alignment of bottom plate 62 with respect to top plate 61, then pressure plate 64 will be aligned with component 42. Also shown in FIG. 5 are pins 46, vias 50 and alignment post 44 of component 42, as well as a bent connection pin 46A. These elements will be more fully described with reference to FIG. 6, below.

Figure 6:
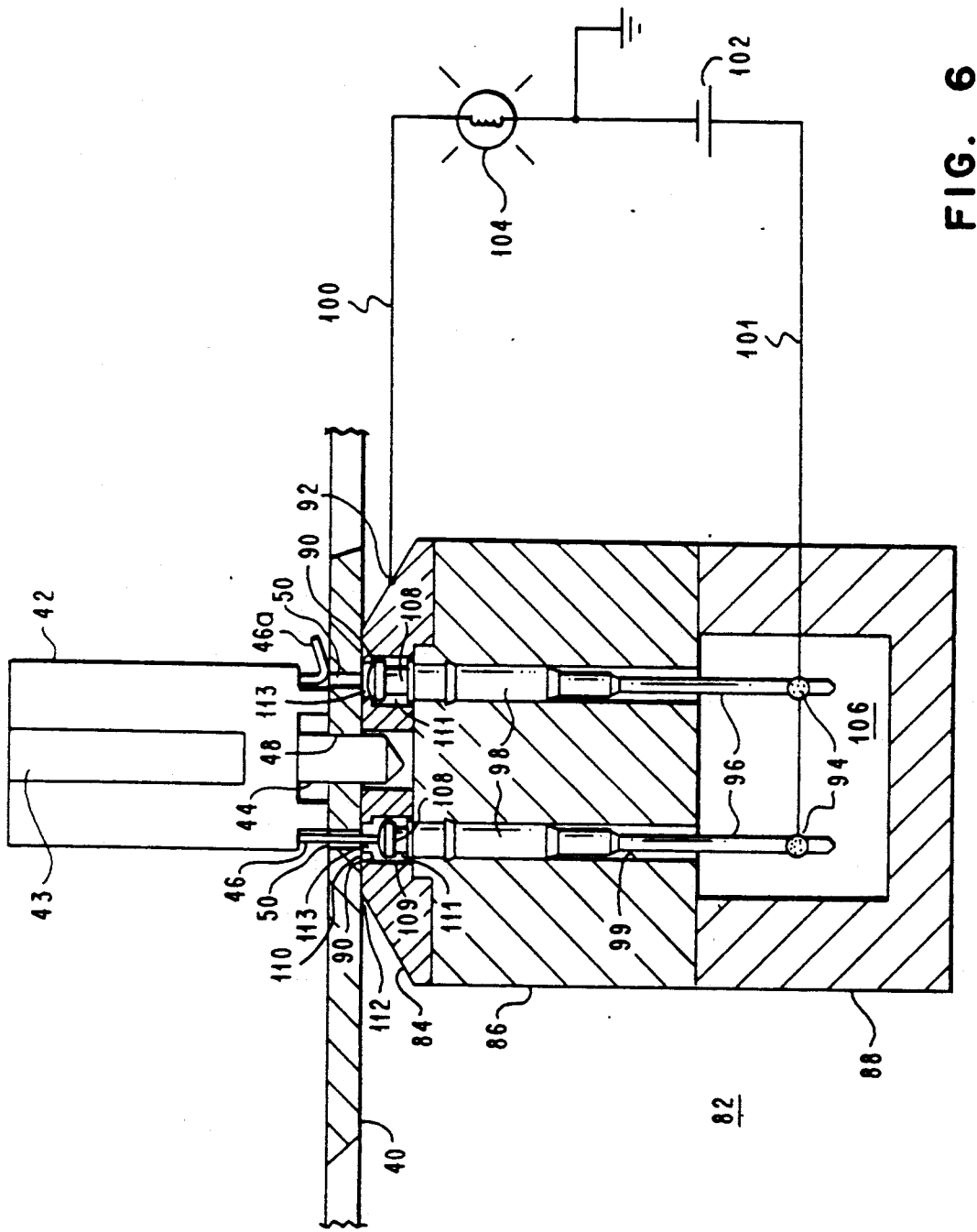
FIG. 6 is a schematic diagram of the crossection of the test block of the present invention which provides an indication of the proper placement of the electrical component pins in circuit board vias.

Testing for the presence of pins 46 within vias 50, concurrently with the manufacturing process of placing components 42 on PCB 40, is another feature of the present invention and will be described with reference to FIG. 6. FIG. 6 is a more detailed view of the test block 82 shown previously in FIG. 5. It can be seen that an electrical component 42 has been pressed on to printed circuit board 40 such that alignment post 44 is inserted into hole 48 and electrical connection pin 46 extends into via 50. However, it can be seen that one of the pins 46 has been bent during the placement process and is denoted in FIG. 6 by reference numeral 46A. Thus, bent pin 46A does not extend into via 50. The present invention by way of test block 82 will instantaneously detect the absence of pin 46A in via 50.

Test block 82 includes a lower body portion 88 constructed of an electrically insulating material such as plastic, polymer, epoxy or the like. Body portion 88 includes a cavity 106, located substantially in the center of portion 88. An upper body portion 86, also constructed of an electrical insulating material, is disposed in abutting relation with lower portion 88 such that cavity 106 forms a hollowed out interior area within test block 82. Lower body portion 88 is rigidly affixed to bottom plate 62 by conventional means, such as gluing, bonding or the like. Top portion 86 is utilized to support test probes 98 which are insertable into a substantially cylindrical hole 99 which runs the entire width of the upper portion 86. Electrical contact heads 108 are slidably disposed within test probe 98 and will contact pins 46 when the pins are properly inserted through vias 50. Additionally, test probe 98 includes biasing means (not shown) such as a spring or the like which will maintain contacts 108 in an upward position. An electrically conductive top layer 84 is affixed by lamination, or the like to top portion 86 and includes a surface 112 which is in abutting relation with PCB 40 when the board is placed within product specific insertion means 80. Surface 112 provides support for PCB 40 during the time when component 42 is being pressed into place, in order to avoid deformation of PCB 40.

Top layer 84 includes a first cylindrical hole 111, defined by outer wall 109 which is sized to allow electrical contacts 108 to be maintained therein. A second cylindrical hole 113, defined by outer wall 110, is provided within conductive layer 84 and in coaxial communication with the first hole 111. The second hole 113 is of a smaller diameter than the first hole 111 such that an annular shoulder 90 is formed at the point of communication therebetween. The diameter of the second hole 113 is less than the diameter of electrical contact 108 such that when contact 108 is upwardly biased an electrically conductive path is maintained from contact 108 through annular shoulder 90. Conversely, when pin 46 is present in via 50 and extends downwardly into the holes 111. 113 electrical contact 108 is maintained within the hole 111 such that an electrically conductive path is not provided between annular shoulder 90 and contact 108. An electrical connection point 92 is provided between layer 84 and a wire 100. Probes 98 also include an electrically conductive lower portion 96 which extends into cavity 106 of lower body portion 88. Electrical connection points 94 then connect the lower portion 96 of probe 98 with a wire 101. It should be noted that electrical connection points 92 .r and 94 are made with conventional means such as soldering, mechanical connectors or the like. Wires 100 and 101 are then connected to an indicator 104 and a power source 102, respectively. Indicator 104 may include a light, buzzer or the like, while a battery may be used for power source 102.

Thus it can be seen that an electrical circuit is made from battery 102 through wire 101, probe end 96, probe 98, electrical contact 108, annular shoulder 90, layer 84, wire 100 to indicator 104 when the presence of a pin 46 is not sensed within via 50, e.g. when a pin is bent such as shown by reference 46A. Under normal conditions when pins are present within via 50 and extend downwardly a sufficient distance, the electrical circuit remains open since an electrical path is not made between contact 108 and annular shoulder 90. Under these conditions, no indication of absent pins 46 is provided to the operator, thereby verifying the proper placement of component 42 on to PCB 40. It should be noted that probes 98 are connected in parallel such that the absence of a single pin will indicate to the operator that a defect has occurred such that an immediate replacement of component 42 can be affected.

Additionally, the present invention is capable of determining whether component 42 is in fact seated properly on PCB 40. It will be understood that if component 42 is not directly seated upon PCB 40 pins 46 will not extend through vias 50 and into the holes 111. 113 a sufficient distance to bias contact 108 downward, thereby maintaining an open condition in the electrical circuit. Thus not only is the absence of a pin 46 detected but also the insufficient extension of pin 46 through via 50 is indicated. This is extremely important since pin 46 must extend past the lower edge of PCB 40 a sufficient distance to provide for proper connection, such as by wave soldering or the like. Further, it can be seen that varying the distance of wall 110 between PCB 40 and annular shoulder 90 will change the distance required for pin 46 to extend through via 50, and past the lower portion of PCB 40, to bias contact 108 downwardly. In this manner, the sensitivity of test block 82 can be altered such that pins 46 of varying distances can be accommodated.

FIGS. 7 and 8 are representative product specific plate showing a plurality of pressure plates 64 attached to top plate 60, alignment posts 68 with tapered end portions 69 and components 42. Bottom plate 62 is shown with stops 66 and a plurality of test blocks 82 attached thereto. FIG. 8 is a plan view of bottom plate 62 taken along line 8-8 of FIG. 7 and illustrates a representative pattern of the placement of electrical components 42 on to PCB 40. Of course, a virtually unlimited number of patterns of components 42 will be used in the production and population of printed circuit boards 40, and FIGS. 7 and 8 merely provide an example of one such pattern.

Although certain preferred embodiments have been shown and described, it should be understood that many changes and modifications may be made therein without departing from the scope of the appended claims.

What is claimed is:

1. An apparatus for pressing at least one electrical component with a plurality of electrically conductive pins on to a circuit board having a plurality of corresponding vias therein, comprising:
    means for applying uniform pressure to said component in a substantially vertical direction including a base plate having means for aligning said circuit board with respect to said base plate and means for supporting said circuit board during said application of pressure, and a top plate having second alignment means for providing vertical alignment of said top plate and said base plate, a pressure plate affixed to said top plate for contacting said electrical component and a spring intermediate said top plate and said pressure plate for varying the pressure applied to said electrical components and accommodating different ones of said electrical components having different heights; and
    means for verifying proper placement of said component on said circuit board by determining the presence of said pins within said vias.

2. An apparatus according to claim 1 wherein said means for applying pressure further comprises:
    press means for receiving said top plate means and said base plate means, and for providing pressure therebetween.

3. An apparatus according to claim 1 wherein a plurality of said electrical components are simultaneously pressed onto said circuit board.

4. An apparatus according to claim 3 wherein said means for verifying comprises
    means for determining whether said pins extend a sufficient distance through said vias.

5. An apparatus according to claim 4 wherein said means for verifying further comprises:
    means for providing an indication that said pin is absent from the corresponding via;
    means for providing electrical power to said indicating means; and
    circuit means for providing an electrically conductive path between said indicating means and said electrical power means when said pin is absent from said corresponding via.

6. An apparatus according to claim 5 wherein said circuit means comprises:
    an electrically insulating body portion:
    plural electrical test probes, disposed within said body portion, having an electrically conductive end portion;
    electrical contact means, disposed on an end of said test probes opposite said end portion and biased to be substantially adjacent said vias on a side of said circuit board opposite said component.

7. An apparatus according to claim 6 wherein said circuit means further comprises an electrically conductive layer disposed between said contact means and said circuit board, said layer including an annular shoulder having a diameter less than said contact means such that said contact is in electrical communication with said annular shoulder when said contact is biased substantially adjacent said circuit board.

8. An apparatus according to claim 7 wherein said contact means is in electrical communication with said annular shoulder when said pin is absent said corresponding via, thereby allowing said electrical power to be provided to said indicating means, and said contact means is biased away from said annular shoulder when said pin is present in said corresponding via, thereby creating an open circuit condition in said circuit means and preventing operation of said indicating means.

9. A method for pressing at least one electrical component with a plurality of electrically conductive pins on to a circuit board having a plurality of corresponding vias therein, comprising the steps of:
    applying uniform pressure to said component in a substantially vertical direction by providing a base plate and a top plate, placing said circuit board onto said base plate by aligning said circuit board with respect to said base plate and supporting said circuit board during said application of pressure, providing by said top plate downward application of pressure to said component including providing vertical alignment of said top plate with said base plate, contacting said electrical component with a pressure plate affixed to said top plate, varying the pressure applied to said electrical component and accommodating different ones of said electrical components having different heights; and
    verifying proper placement of said component on said circuit board by determining the presence of said pins within said vias.

10. A method according to claim 9 wherein said step of applying uniform pressure further comprises:
    providing press means for receiving said top plate and said base plate, and for providing pressure therebetween.

11. A method according to claim 9 further comprising the step of simultaneously pressing a plurality of said electrical components onto said circuit board.

12. A method according to claim 11 wherein said step of verifying comprises the step of determining whether said pins extend a sufficient distance through said vias.

13. A method according to claim 12 wherein said step of verifying further comprises the steps of:
- providing an indication that said pin is absent from the corresponding via;
- providing electrical power to said indicating means; and
- providing an electrically conductive path between said indicating means and said electrical power means when said pin is absent from said corresponding via.

14. A method according to claim 13 wherein said step of providing an electrically conductive path comprises the steps of:
- providing an electrically insulating body portion:
- providing plural electrical test probes, disposed within said body portion, having an electrically conductive end portion; and
- providing electrical contact means, disposed on an end of said test probes opposite said end portion and biased to be substantially adjacent said vias on a side of said circuit board opposite said component.

15. A method according to claim 14 wherein said step of providing an electrically conductive path further comprises the step of providing a conductive layer disposed between said contact means and said circuit board, said layer including an annular shoulder having a diameter less than said contact means such that said contact is in electrical communication with said annular shoulder when said contact is biased substantially adjacent said circuit board.

16. A method according to claim 15 wherein said step of providing contact means comprises the steps of:
- providing said contact means in electrical communication with said annular shoulder when said pin is absent said corresponding via thereby allowing said electrical power to be provided to said indicating means; and
- biasing said contact means away from said annular shoulder when said pin is present in said corresponding via, thereby creating an open circuit condition in said electrically conductive path and preventing operation of said indicating means.

17. An apparatus for sequentially pressing a plurality of electrical components with a plurality of electrically connected pins onto a circuit board having a plurality of corresponding vias therein, comprising:
- means for providing uniform pressure to said component in a substantially vertical direction; and
- means for verifying the proper placement of said component on said circuit board by determining the presence of said pins within said vias and whether said pins extend a sufficient distance through said vias, including means for providing an indication that one of said pins is absent from the corresponding via, means for providing electrical power to said indicating means, and circuit means for providing an electrically conductive path between said indicating means and said electrical power means when said pin is absent form said corresponding via, said circuit means having an electrically insulating body portion, plural electrical test probes with an electrically conductive end portion, disposed within said body portion, and electrical contact means disposed on an end of said test probes opposite said end portion and biased to be substantially adjacent said vias on a side of said circuit board opposite said component.

18. An apparatus according to claim 17 wherein said circuit means further comprises an electrically conductive layer disposed between said contact means and said circuit board, said layer including an annular shoulder having a diameter less than said contact means such that said contact is in electrical communication with said annular shoulder when said contact is biased substantially adjacent said circuit board.

19. An apparatus according to claim 18 wherein said contact means is in electrical communication with said annular shoulder when said pin is absent said corresponding via, thereby allowing said electrical power to be provided to said indicating means, and said contact means is biased away from said annular shoulder when said pin is present in said corresponding via, thereby creating an open condition in said circuit means and preventing operation of said indicating means.

20. A method for pressing at least one electrical component with a plurality of electrically conductive pins onto a circuit board having a plurality of corresponding vias therein, comprising the steps of:
- applying uniform pressure to said component in a substantially vertical direction; and
- verifying the proper placement of said component on said circuit board by determining the presence of said pins within said vias and determining whether said pins extend a sufficient distance through said vias, providing an indication that said pin is absent form the corresponding via, providing electrical power to said indicating means and providing an electrically conductive path between said indicating means and said electrical power means when said pin is absent from said corresponding via, said step of providing an electrically conductive path including providing an electrical insulating body portion, providing plural electrical test probes disposed within said body portion having an electrically conductive end portion and providing electrical contact means disposed on an end of said test probe opposite said end portion and biased to be substantially adjacent said vias on a side of said circuit board opposite said component.

21. A method according to claim 20 wherein said step of providing an electrically conductive path further comprises the step of providing a conductive layer disposed between said contact means and said circuit, said layer including an annular shoulder having a diameter less than said contact means such that said contact as in electrical communication with said annular shoulder when said contact is biased substantially adjacent said circuit board.

22. A method according to claim 21 wherein said step for providing contact means comprises steps of:
- providing said contact means in electrical communication with said annular shoulder when said pin is absent said corresponding via thereby allowing said electrical power to be provided to said indicating means; and
- biasing said contact means away from said annular shoulder when said pin is present in said corresponding via, thereby creating an open circuit condition in said electrically conductive path and preventing operation of said indicating means.

* * * * *